(12) United States Patent
Yagi

(10) Patent No.: US 11,191,188 B2
(45) Date of Patent: Nov. 30, 2021

(54) HEAT DISSIPATION STRUCTURE

(71) Applicant: NEC Platforms, Ltd., Kawasaki (JP)

(72) Inventor: Takahiro Yagi, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 0 days.

(21) Appl. No.: 16/817,808

(22) Filed: Mar. 13, 2020

(65) Prior Publication Data
US 2020/0305303 A1    Sep. 24, 2020

(30) Foreign Application Priority Data

Mar. 18, 2019  (JP) .............................. JP2019-050128

(51) Int. Cl.
*H05K 7/20* (2006.01)
*H05K 5/02* (2006.01)

(52) U.S. Cl.
CPC ......... *H05K 7/2039* (2013.01); *H05K 5/0213* (2013.01)

(58) Field of Classification Search
None
See application file for complete search history.

(56) References Cited

U.S. PATENT DOCUMENTS

| 3,956,673 | A | * | 5/1976 | Seid | ................... | H05K 7/20572 |
| | | | | | | 361/690 |
| 6,301,779 | B1 | * | 10/2001 | Azar | ....................... | B23P 15/26 |
| | | | | | | 165/80.3 |
| 6,994,155 | B2 | * | 2/2006 | Dessiatoun | ............... | F28D 7/00 |
| | | | | | | 165/165 |
| 7,128,131 | B2 | * | 10/2006 | Kubo | ................... | H01L 23/3672 |
| | | | | | | 165/80.3 |
| 7,554,803 | B2 | * | 6/2009 | Artman | .............. | H05K 7/20563 |
| | | | | | | 361/679.49 |

(Continued)

FOREIGN PATENT DOCUMENTS

| JP | S60-149193 U | 10/1985 |
| JP | S63-018888 U | 2/1988 |

(Continued)

OTHER PUBLICATIONS

Japanese Office Action for JP Application No. 2019-050128 dated Jun. 30, 2020 with English Translation.

(Continued)

*Primary Examiner* — Courtney L Smith

(57) ABSTRACT

A heat dissipation structure capable of improving heat dissipation efficiency and regulating temperature distribution of a surface of a housing is provided. A heat dissipation structure 300 is provided in a housing 200 that accommodates a heat generating source 102 therein, the heat dissipation structure 300 including: top surface parts 213 and 223 opposed to each other, in which the top surface part 213 includes a plurality of concave-shaped parts 213B-F that are aligned, the top surface part 223 includes a plurality of concave-shaped parts 223B-F that are aligned, the concave-shaped parts 213B-F of the top surface part 213 are opposed to the concave-shaped parts 223B-F of the top surface part 223, outlets 213A are formed in the concave-shaped parts 213D, 213E, and 213F, and outlets 223A are formed in the concave-shaped parts 223C, 223D, 223E, and 223F.

9 Claims, 6 Drawing Sheets

(56) References Cited

U.S. PATENT DOCUMENTS

| | | | | |
|---|---|---|---|---|
| 8,248,792 B2* | 8/2012 | Wei | ............... | H05K 7/20745 |
| | | | | 361/692 |
| 8,472,194 B2* | 6/2013 | Rivera Hernandez | ............... | |
| | | | | H05K 7/1471 |
| | | | | 361/710 |
| 10,127,949 B2* | 11/2018 | Mayhall | ............... | G11B 33/027 |
| 10,772,188 B1* | 9/2020 | Elsasser | ............... | H05K 7/20145 |
| 2006/0082973 A1* | 4/2006 | Egbert | ............... | H05K 7/20154 |
| | | | | 361/709 |
| 2006/0232930 A1* | 10/2006 | Artman | ............... | H05K 7/20736 |
| | | | | 361/695 |
| 2009/0021913 A1* | 1/2009 | Kuan | ............... | H01L 23/467 |
| | | | | 361/697 |
| 2009/0279256 A1 | 11/2009 | Peng et al. | | |
| 2010/0170662 A1* | 7/2010 | Baba | ............... | H01L 25/072 |
| | | | | 165/104.33 |
| 2012/0155015 A1* | 6/2012 | Govindasamy | ............... | H01L 23/36 |
| | | | | 361/679.46 |
| 2017/0234627 A1* | 8/2017 | Kobayashi | ............... | F28F 1/40 |
| | | | | 165/183 |

FOREIGN PATENT DOCUMENTS

| | | |
|---|---|---|
| JP | 2006-245197 A | 9/2006 |
| WO | 2014/192764 A1 | 12/2014 |

OTHER PUBLICATIONS

Japanese Office Action for JP Application No. 2020-127126 dated Aug. 3, 2021 with English Translation.

* cited by examiner

HEAT DISSIPATION STRUCTURE

INCORPORATION BY REFERENCE

This application is based upon and claims the benefit of priority from Japanese patent application No. 2019-050128, filed on Mar. 18, 2019, the disclosure of which is incorporated herein in its entirety by reference.

TECHNICAL FIELD

The present disclosure relates to a heat dissipation structure of a housing that houses a heat generating source.

BACKGROUND ART

In general, an apparatus that includes a heat generating source inside a housing includes a heat dissipation structure in order to prevent the temperature in a component group/area such as the heat generating source itself or components in the vicinity of the heat generating source where a high temperature above a certain level is not allowed from being increased. This heat dissipation structure releases heat generated in a heat generation unit such as the heat generating source to the air inside the housing by convective heat transfer. Specifically, this heat dissipation structure lowers the temperatures of parts whose temperatures should be lowered via a component such as a heat sink that improves heat dissipation efficiency, via a component that diffuses and regulates the heat dissipation path, or in a direct way.

Heat of the air inside the housing that has been received from the heat generation unit and whose temperature is high is released to an inner surface of an adjacent outer shell of the housing by convective heat transfer. Heat of the outer shell of the housing that has been received from inside the housing is conducted in the outer shell of the housing, and is then released to the air outside the housing from the surface of the outer shell of the housing.

Further, in general, in order to further lower the temperatures of the parts whose temperatures should be lowered, a method of adding a heat movement path, which path is due to movement of air, such as providing ventilation holes in the outer shell of the housing for ventilation, is typically used. In this natural air cooling, basically, an air flow that air is sucked in from holes positioned to be below the heat source in the gravitational direction, and air which received the heat from the heat source is exhausted from holes positioned to be above the heat source is formed. Therefore, in order to further facilitate heat dissipation due to this convection and improve the efficiency, the amount of inflow and outflow of the air is preferably increased. That is, it can be said that the greater the number of holes and the larger the size of each of the holes become, the larger the amount of heat released to the air outside the housing becomes.

However, the temperature in an area near the exhaust holes of the housing becomes higher than that in a case in which exhaust holes are not provided since the amount of heat received due to convective heat transfer from the air is large in the area near the exhaust holes of the housing. In general, an allowable temperature of the surface of the housing is defined for each apparatus in view of usage and safety considerations. Therefore, it is required to make the temperature in the local area near the exhaust holes whose temperature becomes high equal to or smaller than the defined allowable temperature.

On the other hand, in order to maximize the heat dissipation efficiency from the surface of the housing to the air outside the housing due to the convective heat transfer, it is desirable that the temperature of the surface of the housing be a high temperature and the temperature distribution thereof be uniform as much as possible as long as the temperature does not exceed the defined allowable temperature.

International Patent Publication No. WO 2014/192764 discloses a housing including a heat dissipation part having a plurality of holes provided in a lower part and an upper part of a rear cabinet of a TV receiver. Further, the rear cabinet disclosed in International Patent Publication No. WO 2014/192764 is tilted forward toward an upper side. Therefore, in International Patent Publication No. WO 2014/192764, a plurality of recessed parts are formed in an inclined part of the rear cabinet, and holes for exhaustion are provided in each of the recessed parts, whereby the size of each of the holes is made uniform and the heat is uniformly released.

In the housing disclosed in International Patent Publication No. WO 2014/192764, however, the temperature distribution and the like due to the distance from the heat generating source to the exhaust hole varying is not taken into account, and it is thus possible that there is a locally high temperature part on a surface of the housing.

As described above, it is difficult to regulate a balance between occurrence of a locally high temperature area on the surface of the housing due to the arrangement of a large number of exhaust holes and equalization of the temperature distribution of the surface of the housing in high dimensions. Therefore, it is difficult to achieve a heat dissipation state optimal for an apparatus that includes the heat generating source inside the housing.

SUMMARY

An object of the present disclosure is to provide a heat dissipation structure capable of improving heat dissipation efficiency and regulating temperature distribution of a surface of a housing.

A heat dissipation structure according to a first aspect of the present disclosure is a heat dissipation structure including: a plurality of constituting members opposed to each other, in which each of the constituting members includes a plurality of concave-shaped parts that are aligned, at least a part of the plurality of concave-shaped parts of one of the constituting members is opposed to at least a part of the plurality of concave-shaped parts of another one of the constituting members, and an outlet is formed in at least a part of the plurality of concave-shaped parts.

BRIEF DESCRIPTION OF DRAWINGS

The above and other aspects, features and advantages of the present disclosure will become more apparent from the following description of certain exemplary embodiments when taken in conjunction with the accompanying drawings, in which.

EMBODIMENTS

First Embodiment

Figure 1:
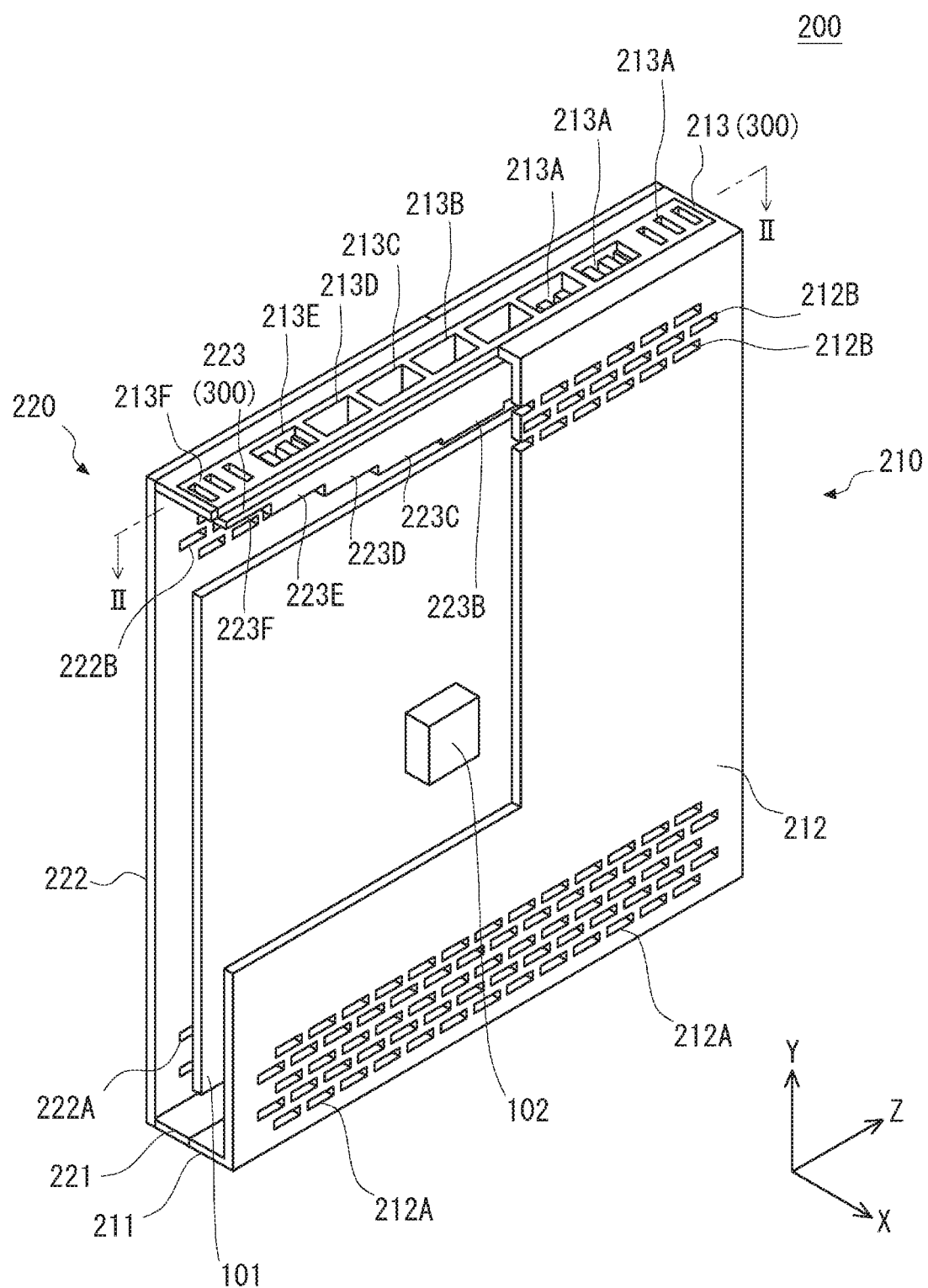
FIG. 1 is a perspective view showing a housing having a heat dissipation structure according to a first embodiment of the present disclosure.
Figure 2:
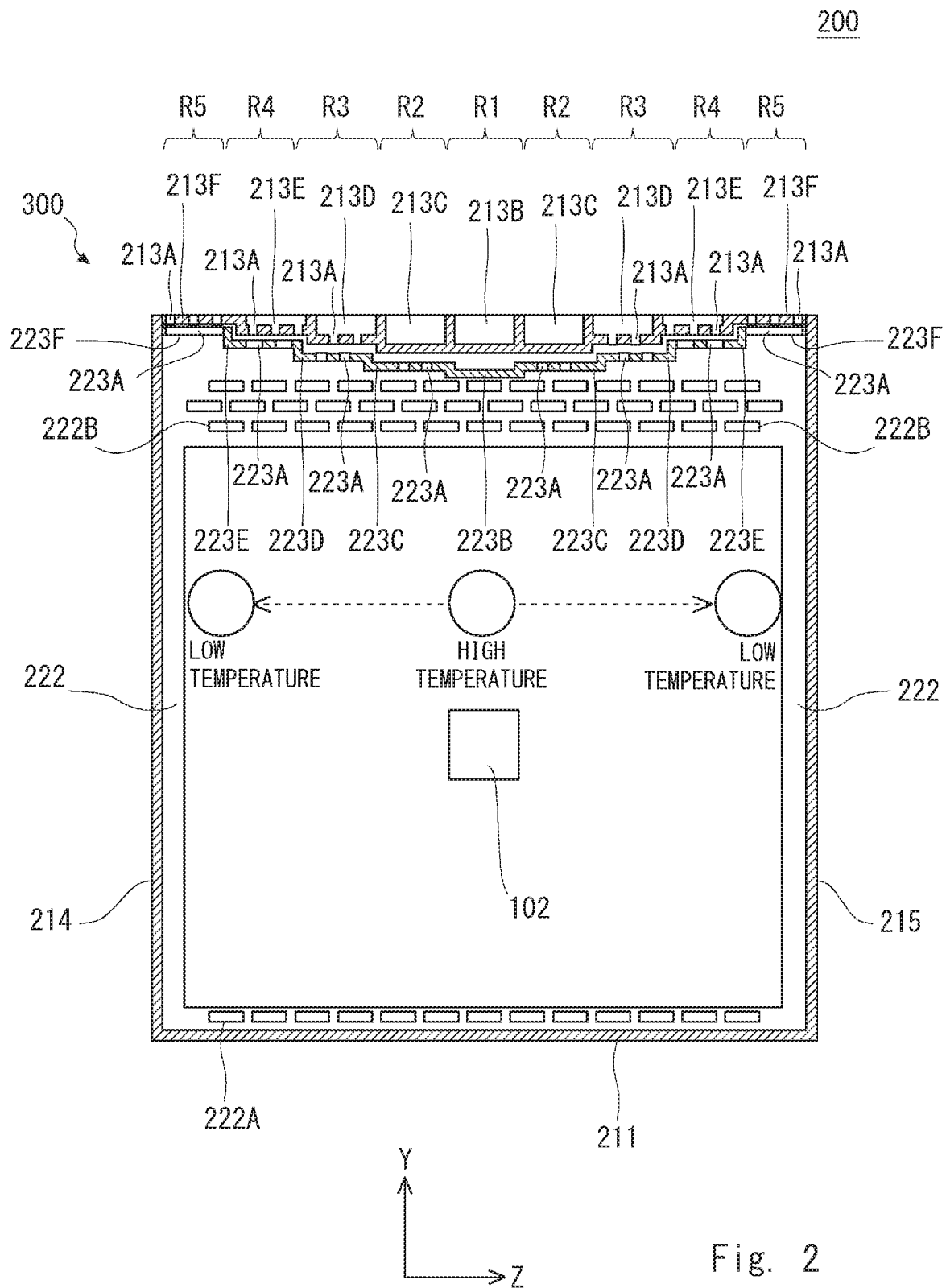
FIG. 2 is a cross-sectional view showing the housing having the heat dissipation structure according to the first embodiment of the present disclosure.

In the following description, with reference to the drawings, an embodiment of the present disclosure will be explained. FIG. 1 is a perspective view showing a housing 200 having a heat dissipation structure 300 according to a first embodiment. In FIG. 1, the housing 200 is partially cut and a part inside the housing 200 is partially shown. FIG. 2 is a cross-sectional view showing the housing 200 including the heat dissipation structure 300 according to the first embodiment. Specifically, FIG. 2 is a cross-sectional view of the housing 200 taken along the line II-II shown in FIG. 1 and is a view of the housing 200 seen from a side surface part 212 of a first housing part. In this specification, the X-axis direction is the right-left direction of the housing 200, the Y-axis direction is the vertical direction of the housing 200, and the Z-axis direction is the front-back direction of the housing 200.

As shown in FIG. 1, the housing 200 accommodates a substrate 101 on which a heat generating source 102 is mounted. The heat generating source 102 is a component that is arranged inside the housing 200 and generates heat itself, and may be, for example, an electronic component mounted on the substrate 101, or a device such as a motor. In this specification, as one example, the heat generating source 102 that is configured to be mounted on the substrate 101 will be described. Further, while an example in which one heat generating source 102 is provided in the housing 200 will be described in this specification in order to simplify the description, a plurality of heat generating sources 102 may be accommodated in the housing 200. Further, a heat sink like member may be arranged in the housing 200, and a heat transfer sheet, thermally conductive grease or the like may be provided between the heat generating source 102 and the heat sink like member. Further, the substrate 101 is accommodated inside the housing 200 in such a way that the substrate 101 becomes substantially parallel to the Y-Z plane. Further, the heat generating source 102 is mounted on the surface of a first housing part 210 (described later) of the substrate 101 on the side of the side surface part 212.

The housing 200 is normally composed of a plurality of members. These plurality of members are assembled, whereby the housing 200 is formed. In this first embodiment, the housing 200 includes a first housing part 210 and a second housing part 220. In other words, the housing 200 is formed of the first housing part 210 and the second housing part 220 that are combined with each other. Further, the first housing part 210 forms the X-axis positive side of the housing 200 and the second housing part 220 forms the X-axis negative side of the housing 200.

The first housing part 210 includes a bottom surface part 211, a side surface part 212 that is substantially parallel to the Y-Z plane, a top surface part 213, and two side surface parts 214 and 215 that are substantially parallel to the X-Y plane. Further, the side surface part 214 is provided in the front side (Z-axis negative side) of the side surface part 212 and the top surface part 213, and the side surface part 215 is provided in the back side (Z-axis positive side) thereof. Further, the side surface part 214 and the side surface part 215 are extended from the side surface part 212 to a side surface part 222 of the second housing part 220. Further, the top surface part 213 is extended from the side surface part 212 to the side surface part 222 of the second housing part 220.

Further, a plurality of inlets 212A are formed in the lower part of the side surface part 212. Further, a plurality of outlets 212B are formed in the upper part of the side surface part 212. Further, a plurality of outlets 213A are formed in the top surface part 213.

The second housing part 220 includes a bottom surface part 221, a side surface part 222 that is substantially parallel to the Y-Z plane, and a top surface part 223. That is, the side surface part 222 is opposed to the side surface part 212 of the first housing part 210. Further, the top surface part 223 is extended from the side surface part 222 to the side surface part 212 of the first housing part 210. Further, the top surface part 223 of the second housing part 220 is positioned in a part lower (Y-axis negative side) than a part where the top surface part 213 of the first housing part 210 is positioned.

Further, a plurality of inlets 222A are formed in a lower part of the side surface part 222. Further, a plurality of outlets 222B are formed in an upper part of the side surface part 222. Further, a plurality of outlets 223A are formed in the top surface part 223.

The heat dissipation structure 300 is arranged in the housing 200 that accommodates the heat generating source 102 therein. Specifically, the heat dissipation structure 300 includes the top surface part 213 of the first housing part 210 and the top surface part 223 of the second housing part 220, which are constituting members opposed to each other. Note that the heat dissipation structure 300 may include components other than the top surface part 213 of the first housing part 210 and the top surface part 223 of the second housing part 220.

The top surface part 213 of the first housing part 210 includes a plurality of concave-shaped parts 213B, 213C, 213D, 213E, and 213F that are aligned. Specifically, the top surface part 213 of the first housing part 210 includes the plurality of concave-shaped parts 213B, 213C, 213D, 213E, and 213F aligned in such a way that they become higher in a stepwise manner as the distance from a part in the vicinity of a part immediately above the heat generating source 102 increases.

More specifically, the concave-shaped parts 213B, 213C, 213D, 213E, and 213F are arranged in this order from the part immediately above the heat generating source 102 toward the end part of the first housing part 210 on the Z-axis negative side and the end part thereof on the Z-axis positive side. Further, the depth of the concave-shaped part 213B is the same as that of the concave-shaped part 213C, and their depth is larger than those of the concave-shaped parts 213D, 213E, and 213F. The depths of the concave-shaped parts 213D, 213E, and 213F decrease in this order.

Further, the outlet 213A is formed in at least a part of the plurality of concave-shaped parts 213B, 213C, 213D, 213E, and 213F. Specifically, in the examples shown in FIGS. 1 and 2, the plurality of outlets 213A provided in the top surface part 213 are provided in the bottom surface parts of the concave-shaped parts 213D, 213E, and 213F.

The top surface part 223 of the second housing part 220 includes a plurality of concave-shaped parts 223B, 223C, 223D, 223E, and 223F that are aligned. Specifically, the top surface part 223 of the second housing part 220 includes the plurality of concave-shaped parts 223B, 223C, 223D, 223E, and 223F in such a way that that they become higher in a stepwise manner as the distance from the part in the vicinity of the part immediately above the heat generating source 102 increases.

Specifically, the concave-shaped parts 223B, 223C, 223D, 223E, and 223F are arranged in this order from the part immediately above the heat generating source 102 toward the end part of the second housing part 220 on the Z-axis negative side and the end part thereof on the Z-axis positive side. The depths of the concave-shaped parts 223B, 223C, 223D, 223E, and 223F decrease in this order.

Further, the outlet 223A is formed in at least a part of the plurality of concave-shaped parts 223B, 223C, 223D, 223E, and 223F. Specifically, in the examples shown in FIGS. 1 and 2, a plurality of outlets 223A provided in the top surface part 223 are provided in the bottom surface parts of the concave-shaped parts 223C, 223D, 223E, and 223F.

Further, at least a part of the plurality of concave-shaped parts 213B, 213C, 213D, 213E, and 213F of the top surface part 213 of the first housing part 210 is opposed to at least a part of the plurality of concave-shaped parts 223B, 223C, 223D, 223E, and 223F of the top surface part 223 of the second housing part 220.

Specifically, in the examples shown in FIGS. 1 and 2, the concave-shaped part 213B of the first housing part 210 and the concave-shaped part 223B of the second housing part 220 are opposed to each other. In other words, the position of the concave-shaped part 213B of the first housing part 210 in the Z-axis direction and the position of the concave-shaped part 223B of the second housing part 220 in the Z-axis direction are substantially the same.

Likewise, the concave-shaped part 213C of the first housing part 210 and the concave-shaped part 223C of the second housing part 220 are opposed to each other. Further, the concave-shaped part 213D of the first housing part 210 and the concave-shaped part 223D of the second housing part 220 are opposed to each other. Further, the concave-shaped part 213E of the first housing part 210 and the concave-shaped part 223E of the second housing part 220 are opposed to each other. Further, the concave-shaped part 213F of the first housing part 210 and the concave-shaped part 223F of the second housing part 220 are opposed to each other.

Further, the number of outlets 213A provided in the concave-shaped part 213D, the number of outlets 213A provided in the concave-shaped part 213E, and the number of outlets 213A provided in the concave-shaped part 213F increase in this order. In other words, in the top surface part 213, the number of outlets 213A provided in the concave-shaped parts 213D, 213E, and 213F increases as the distance from the part in the vicinity of the part immediately above the heat generating source 102 increases. In the example shown in FIG. 2, the number of outlets 213a provided in the concave-shaped parts 213E and 213F is larger than the number of outlets 213A provided in the concave-shaped part 213D.

Further, the widths (lengths that are parallel to the Z axis) of the outlets 223A provided in the concave-shaped parts 223D, 223E, and 223F increase in this order. In other words, in the top surface part 223, the widths of the outlets 223A provided in the concave-shaped parts 223D, 223E, and 223F increase as the distance from the part in the vicinity of the part immediately above the heat generating source 102 increases.

Further, the positions of the outlets 213A provided in the concave-shaped part 213D in the Z-axis direction are different from the positions of the outlets 223A provided in the concave-shaped part 223D in the Z-axis direction.

Further, at least a part of the plurality of outlets 213A provided in the concave-shaped part 213E and at least a part of the outlets 223A of the concave-shaped part 223E are provided in an overlapping position at least in the Z-axis direction.

Further, the outlets 213A provided in the concave-shaped part 213F are provided in a position overlapping the position of the outlet 223A of the concave-shaped part 223F at least in the Z-axis direction.

In other words, the deviation between the positions of the outlets 213A provided in the top surface part 213 in the Z-axis direction and the positions of the outlets 223A provided in the top surface part 223 in the Z-axis direction decreases as the distance from the part in the vicinity of the part immediately above the heat generating source 102 increases.

Note that the structure of the aforementioned heat dissipation structure 300 is one example, and parameters of the numbers, the shapes, the positions and the like of the concave-shaped parts 213B, 213C, 213D, 213E, and 213F and the concave-shaped parts 223B, 223C, 223D, 223E, and 223F, and the numbers, the shapes, the positions and the like of the outlets 213A and 223A are set in various ways, whereby it is possible to perform flexible temperature regulation such as improving the heat dissipation efficiency and making the temperature distribution of the surface of the housing 200 (top surface in this first embodiment) uniform.

Next, the way in which heat is transferred in the heat dissipation structure according to the first embodiment will be explained. Now, for the sake of description, as shown in FIG. 2, in an area between the heat generating source 102 and the heat dissipation structure 300, a region in which the concave-shaped parts 213B and 223B are located in the Z-axis direction is set to be a first region R1, a region in which the concave-shaped parts 213C and 223C are located is set to be a second region R2, a region in which the concave-shaped parts 213D and 223D are located is set to be a third region R3, a region in which the concave-shaped parts 213E and 223E are located is set to be a fourth region R4, and a region in which the concave-shaped parts 213F and 223F are located is set to be a fifth region R5. That is, the first region R1 is a region positioned in a part in the vicinity of a part immediately above the heat generating source 102 and in which the temperature of the air in the housing 200 becomes the highest. Further, the fifth region R5 is a region that is the farthest from the heat generating source 102 and in which the temperature of the air in the housing 200 becomes relatively low.

In the housing 200, the heat of the heat generating source 102 is moved to the substrate 101 due to heat conduction, whereby the substrate 101 is heated. Further, the air in the housing 200 is heated by the heat generating source 102 and the heated substrate 101, which causes natural convection to occur in the housing 200, whereby the temperature of the upper area of the housing 200 becomes high, and the temperature of the lower area thereof becomes low. Further, the air that has been sucked into the housing 200 from the plurality of inlets 212A provided in the lower part of the first housing part 210 and the plurality of inlets 222A provided in the lower part of the second housing part 220 is also heated as it receives heat from the heat generating source 102 and the heated substrate 101. Then, the air that has been mainly heated by the heat generating source 102 ascends by a buoyant force while releasing heat to the inner surface and the like of the housing 200 by convective heat transfer and then hits the bottom surfaces of the concave-shaped parts 213B, 213C, 213D, 213E, and 213F and the concave-shaped parts 223B, 223C, 223D, 223E, and 223F that form the heat dissipation structure 300. Then the concave-shaped parts 213B, 213C, 213D, 213E, and 213F and the concave-shaped parts 223B, 223C, 223D, 223E, and 223F serve to regulate the heat transfer amount from the air inside the housing 200 to the housing 200, and make the temperature distribution of the surface of the housing 200 uniform so that the temperature becomes close to a predetermined standard upper-limit temperature.

The first region R1 is a region that is positioned in the vicinity of the part immediately above the heat generating source 102 and in which the temperature of the air in the housing 200 becomes the highest. Therefore, the outlet 223A is not provided in the concave-shaped part 223B that is positioned in the first region R1, and therefore the hot air flow does not directly contact the bottom surface part of the concave-shaped part 213B. Further, the distance between the bottom surface part of the concave-shaped part 213B of the first region R1 and the bottom surface part of the concave-shaped part 223B of the first region R1 becomes larger than the distance between the bottom surface parts of the concave-shaped parts 213C, 213D, 213E, and 213F and the bottom surface parts of the concave-shaped parts 223C, 223D, 223E, and 223F of the other regions R2-R5. Accordingly, the heat in the bottom surface part of the concave-shaped part 223B heated by heat transfer from the air that has been mainly heated by the heat generating source 102 and has ascended is not likely to be transferred to the bottom surface part of the concave-shaped part 213B. Further, the concave-shaped part 213B of the first region R1 is deeper than the concave-shaped parts 213D, 213E, and 213F of the other regions R3-R5. Accordingly, heat that has been transferred to the bottom surface part of the concave-shaped part 213B of the first region R1 is not likely to be transferred to the surface of the top surface part (top surface part 213 of the first housing part 210) of the housing 200 by heat conduction. Accordingly, in the first region R1, the surface temperature of the housing 200 does not exceed a temperature around the standard upper-limit temperature.

The temperature of the air that ascends since it is mainly heated by the heat generating source 102 and hits the bottom surface part of the concave-shaped part 223C of the second region R2 is lower than the temperature of the air that hits the bottom surface part of the concave-shaped part 223B of the first region R1. Therefore, the outlets 223A are provided in the bottom surface part of the concave-shaped part 223C of the second region R2, and at least a part of the air that has reached the bottom surface part of the concave-shaped part 223C directly reaches the bottom surface part of the concave-shaped part 213C. Further, the distance between the bottom surface part of the concave-shaped part 213C and the bottom surface part of the concave-shaped part 223C of the second region R2 is narrower than the distance between the bottom surface part of the concave-shaped part 213B and the bottom surface part of the concave-shaped part 223B of the first region R1. Therefore, heat is more likely to be transferred between the concave-shaped part 223C and the concave-shaped part 213C of the second region R2 than it is between the concave-shaped part 223B and the concave-shaped part 213B of the first region R1. Accordingly, heat is more likely to be transferred between the concave-shaped part 223C and the concave-shaped part 213C of the second region R2 by the amount that corresponds to the difference between the temperature of the air that reaches the bottom surface part of the concave-shaped part 223B of the first region R1 and the temperature of the air that reaches the bottom surface part of the concave-shaped part 223C of the second region R2. Therefore, in the second region R2, the surface temperature of the housing 200 is regulated in such a way that this temperature becomes close to the standard upper-limit temperature.

Similar to the structure of the concave-shaped part 223C of the second region R2, the outlets 223A are provided in the bottom surface part of the concave-shaped part 223D of the third region R3, and at least a part of the air that has reached the bottom surface part of the concave-shaped part 223D directly reaches the bottom surface part of the concave-shaped part 213D. Further, the outlets 213A are provided also in the bottom surface part of the concave-shaped part 213D of the third region. On the other hand, the positions of the outlets 213A provided in the concave-shaped part 213D in the Z-axis direction are different from the positions of the outlets 223A provided in the concave-shaped part 223D in the Z-axis direction. This deviation between the positions of the outlets 213A and the positions of the outlets 223A prevents the air that has passed through the outlets 223A from being directly passing through the outlets 213A. Accordingly, heat is likely to be transferred between the concave-shaped part 223D and the concave-shaped part 213D of the third region R3, whereas heat is not likely to be transferred to the surface of the housing 200 by the amount that corresponds to the difference between the temperature of the air that reaches the bottom surface part of the concave-shaped part 223C of the second region R2 and the temperature of the air that reaches the bottom surface part of the concave-shaped part 223D of the third region R3. Therefore, in the third region R3, the surface temperature of the housing 200 is regulated in such a way that this temperature becomes close to the standard upper-limit temperature.

The width of the outlets 223A provided in the bottom surface part of the concave-shaped part 223E of the fourth region R4 is wider than that of the outlets 223A provided in the bottom surface part of the concave-shaped part 223D of the third region R3. Further, the number of outlets 213A provided in the bottom surface part of the concave-shaped part 213E of the fourth region is larger than the number of outlets 213A provided in the bottom surface part of the concave-shaped part 213D of the third region. Then at least a part of the plurality of outlets 213A provided in the concave-shaped part 213E and at least a part of the outlets 223A of the concave-shaped part 223E are provided in an overlapping position at least in the Z-axis direction. Therefore, in the fourth region R4, at least a part of the air that has passed through the outlet 223A directly passes through the outlet 213A. Accordingly, heat is likely to be transferred between the concave-shaped part 223E and the concave-shaped part 213E of the fourth region R4 by the amount that corresponds to the difference between the temperature of the air that reaches the bottom surface part of the concave-shaped part 223D of the third region R3 and the temperature of the air that reaches the bottom surface part of the concave-shaped part 223E of the fourth region R4. Therefore, in the fourth region R4, the surface temperature of the housing 200 is regulated in such a way that this temperature becomes close to the standard upper-limit temperature.

The fifth region R5 is a region that is the farthest from the heat generating source 102 and in which the air in the housing 200 has a relatively low temperature. Therefore, the depth of the concave-shaped part 223F and the depth of the concave-shaped part 213F of the fifth region R5 are the smallest, and there is no depth in the example shown in FIG. 2. Further, the width of the outlet 223A provided in the bottom surface part of the concave-shaped part 223F of the fifth region R5 is wider than the width of the outlet 223A provided in the bottom surface part of the concave-shaped part 223E of the fourth region R4. In the example shown in FIG. 2, the outlet 223A overlaps all the outlets 213A provided in the bottom surface part of the concave-shaped part 213F. Therefore, in the fifth region R5, the air that has passed through the outlet 223A directly passes through the outlet 213A. Accordingly, heat is likely to be transferred between the concave-shaped part 223F and the concave-shaped part 213F of the fifth region R5 by the amount that corresponds to the difference between the temperature of the air that reaches the bottom surface part of the concave-shaped part 223E of the fourth region R4 and the air that reaches the bottom surface part of the concave-shaped part 223F of the fifth region R5. Accordingly, in the fifth region R5, the surface temperature of the housing 200 is regulated in such a way that this temperature becomes close to the standard upper-limit temperature.

According to the heat dissipation structure 300 according to the first embodiment described above, the parameters such as the numbers, the shapes, the positions and the like of the concave-shaped parts 213B, 213C, 213D, 213E, and 213F of the top surface part 213 and the concave-shaped parts 223B, 223C, 223D, 223E, and 223F of the top surface part 223 opposed to the top surface part 213, the numbers, the shapes, the positions and the like of the outlets 213A and 223A are set in various ways, whereby it is possible to provide the heat dissipation structure 300 capable of improving the heat dissipation efficiency and regulating the temperature distribution of the surface of the housing 200.

Further, in the top surface part 213 of the first housing part 210, the depth of the concave-shaped part 213B is the same as that of the concave-shaped part 213C, and their depth is deeper than those of the concave-shaped parts 213D, 213E, and 213F. Further, the depths of the concave-shaped parts 213D, 213E, and 213F decrease as the distance from the part in the vicinity of the part immediately above the heat generating source 102 increases.

Further, in the top surface part 223 of the second housing part 220, the depths of the concave-shaped parts 223B, 223C, 223D, 223E, and 223F decrease as the distance from the part in the vicinity of the part immediately above the heat generating source 102 increases.

Accordingly, the distance between the bottom surface parts of the concave-shaped parts 223B, 223C, 223D, 223E, and 223F of the top surface part 223 of the second housing part 220 and the bottom surface parts of the concave-shaped parts 213B, 213C, 213D, 213E, and 213F of the top surface part 213 of the first housing part 210 can be regulated. Therefore, the heat transfer from the bottom surface parts of the concave-shaped parts 223B, 223C, 223D, 223E, and 223F of the top surface part 223 of the second housing part 220 to the bottom surface parts of the concave-shaped parts 213B, 213C, 213D, 213E, and 213F of the top surface part 213 of the first housing part 210 can be regulated in accordance with the temperature distribution of the air in the housing 200.

Further, by regulating the depths of the concave-shaped parts 213B, 213C, 213D, 213E, and 213F of the top surface part 213 of the first housing part 210, the heat transfer from the bottom surface parts of the concave-shaped parts 213B, 213C, 213D, 213E, and 213F to the surface of the housing 200 can be regulated in accordance with the temperature distribution of the air in the housing 200.

Further, the number of outlets 213A provided in the concave-shaped parts 213B, 213C, 213D, 213E, and 213F of the top surface part 213 of the first housing part 210 increases as the distance from the part in the vicinity of the part immediately above the heat generating source 102 increases.

Accordingly, it is possible to regulate the heat transfer amount of the top surface part of the housing 200 from the air that has reached the bottom surface parts of the concave-shaped parts 213B, 213C, 213D, 213E, and 213F in accordance with the temperature distribution of the air in the housing 200.

Further, the sizes of the outlets 223A provided in the concave-shaped parts 223B, 223C, 223D, 223E, and 223F of the top surface part 223 of the second housing part 220 increase as the distance from the part in the vicinity of the part immediately above the heat generating source 102 increases.

Accordingly, the degree that the air that has ascended since it is mainly heated by the heat generating source 102 and has reached the bottom surface parts of the concave-shaped parts 223B, 223C, 223D, 223E, and 223F reaches the bottom surface parts of the concave-shaped parts 213B, 213C, 213D, 213E, and 213F of the top surface part 213 of the first housing part 210 can be adjusted in accordance with the temperature distribution of the air in the housing 200.

Further, the deviation between the positions of the outlets 213A provided in the top surface part 213 in the Z-axis direction and the positions of the outlets 223A provided in the top surface part 223 in the Z-axis direction decreases as the distance from the part in the vicinity of the part immediately above the heat generating source 102 increases.

Accordingly, the amount of the air that has passed through the outlets 223A of the concave-shaped parts 223D, 223E, and 223F of the top surface part 223 of the second housing part 220 directly passing through the outlets 213A of the concave-shaped parts 213D, 213E, and 213F of the top surface part 213 of the first housing part 210 and the flow rate thereof can be regulated in accordance with the temperature distribution of the air in the housing 200.

Next, with reference to FIGS. 3-6, modified examples of the heat dissipation structure 300 according to the first embodiment will be explained. FIGS. 3-6 are cross-sectional views of a concave-shaped part 213X that represents the concave-shaped parts 213B, 213C, 213D, 213E, and 213F provided in the top surface part 213 and a concave-shaped part 223X that represents the concave-shaped parts 223B, 223C, 223D, 223E, and 223F provided in the top surface part 223 that form the heat dissipation structure 300 according to a modified example.

In the aforementioned first embodiment, parameters such as the depth of the concave-shaped part 213X and that of the concave-shaped part 223X, the sizes of the outlets 213A and those of the outlets 223A, the number of outlets 213A and that of outlets 223A, the amount of deviation between the positions of the outlets 213A in the Z-axis direction and the positions of the outlets 223A in the Z-axis direction, and the distance between the bottom surface part of the concave-shaped part 213X and the bottom surface part of the concave-shaped part 223X are all adjusted so that heat is more likely to be transferred to the top surface part 213 as the distance from the part in the vicinity of the part immediately above the heat generating source 102 increases. However, the method of adjusting the parameters of the concave-shaped part 213X and the concave-shaped part 223X is not limited to that described in the above first embodiment. For each combination of the concave-shaped part 213X and the concave-shaped part 223X opposed to each other, parameters adjusted so that heat is likely to be transferred and parameters adjusted so that heat is not likely to be transferred are separately combined with each other, whereby it is possible to perform adjustment more finely. In the following modified examples 1-4, other examples of adjustment of the parameters of the concave-shaped part 213X and the concave-shaped part 223X are shown.

In Modified Examples 1-4 shown in FIGS. 3-6, the conditions regarding the positions and the surrounding environments of the concave-shaped part 213X and the concave-shaped part 223X such as the distance of the concave-shaped part 213X and the concave-shaped part 223X from the heat generating source 102, the temperature of the air in the vicinity of the bottom surface part of the concave-shaped part 223X and the like the same. The modified examples 1-4 are examples of separately adjusting the aforementioned parameters of the concave-shaped part 213X and the concave-shaped part 223X so that heat is likely to be transferred or heat is not likely to be transferred, thereby adjusting the temperature of the top surface part 213 to make it uniform.

Modified Example 1

Figure 3:
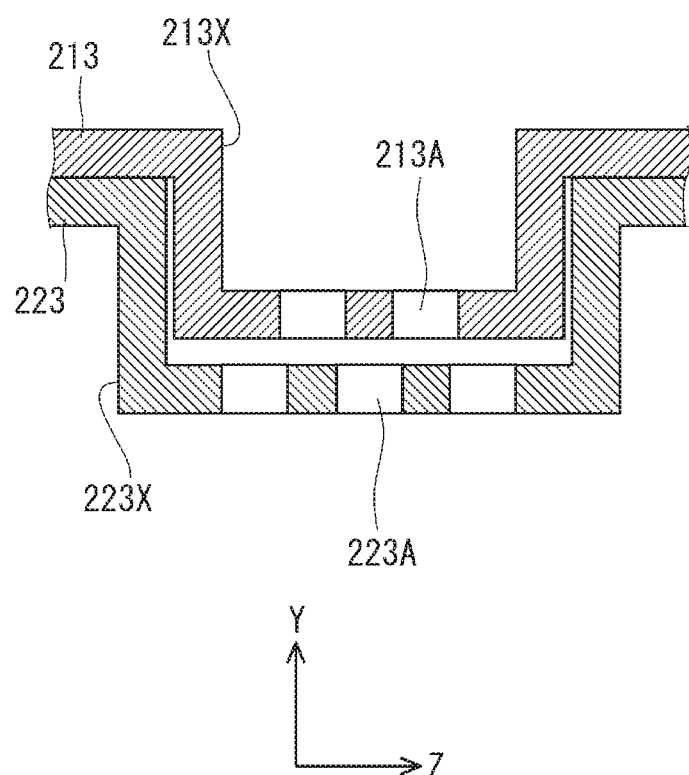
FIG. 3 is a cross-sectional view for describing a heat dissipation structure according to a modified example 1 of the first embodiment of the present disclosure.

FIG. 3 shows a heat dissipation structure 300A according to a modified example 1 of the first embodiment. In the heat dissipation structure 300A according to the modified example 1, two outlets 213A are formed in the bottom surface part of the concave-shaped part 213X. Further, three outlets 223A are formed in the bottom surface part of the concave-shaped part 223X. Further, the positions of the outlets 213A provided in the bottom surface part of the concave-shaped part 213X in the Z-axis direction and the positions of the outlets 223A provided in the bottom surface part of the concave-shaped part 223X in the Z-axis direction are different from each other. Further, the bottom surface part of the concave-shaped part 213X is separated from the bottom surface part of the concave-shaped part 223X by a predetermined distance.

Modified Example 2

Figure 4:
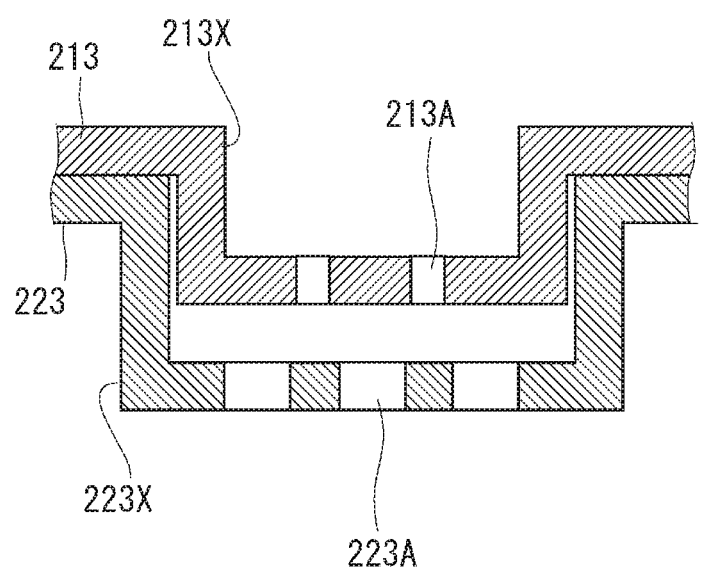
FIG. 4 is a cross-sectional view for describing a heat dissipation structure according to a modified example 2 of the first embodiment of the present disclosure.
Figure 4:
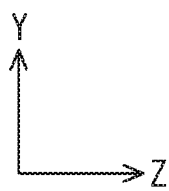

FIG. 4 shows a heat dissipation structure 300B according to a modified example 2 of the first embodiment. In the heat dissipation structure 300B according to the modified example 2, the sizes of the outlets 213A formed in the bottom surface part of the concave-shaped part 213X according to the modified example 2 is smaller than the sizes of the outlets 213A formed in the bottom surface part of the concave-shaped part 213X according to the modified example 1. Further, the positions of the outlets 213A provided in the bottom surface part of the concave-shaped part 213X in the Z-axis direction and the positions of the outlets 223A provided in the bottom surface part of the concave-shaped part 223X in the Z-axis direction according to the modified example 2 are different from each other, similar to the example described in the modified example 1. Further, the depth of the concave-shaped part 213X according to the modified example 2 is smaller than the depth of the concave-shaped part 213X according to the modified example 1. On the other hand, the shape of the concave-shaped part 223X and the number and the size of the outlets 223A according to the modified example 2 are the same as those of the concave-shaped part 223X according to the modified example 1. Therefore, the distance between the bottom surface part of the concave-shaped part 213X and the bottom surface part of the concave-shaped part 223X in the modified example 2 is wider than the distance between the bottom surface part of the concave-shaped part 213X and the bottom surface part of the concave-shaped part 223X in the modified example 1. That is, in the modified example 2, unlike the modified example 1, parameters adjusted so that heat is likely to be transferred (the depth of the concave-shaped part 213X) and parameters adjusted so that heat is not likely to be transferred (the size of the outlet 213A, and the distance between the bottom surface part of the concave-shaped part 213X and the bottom surface part of the concave-shaped part 223X) are combined with each other. Accordingly, in the heat dissipation structure 300B according to the modified example 2, the heat and the temperature transferred to the top surface part 213 are adjusted in such a way that they eventually become similar to those in the heat dissipation structure 300A according to the modified example 1.

Modified Example 3

Figure 5:
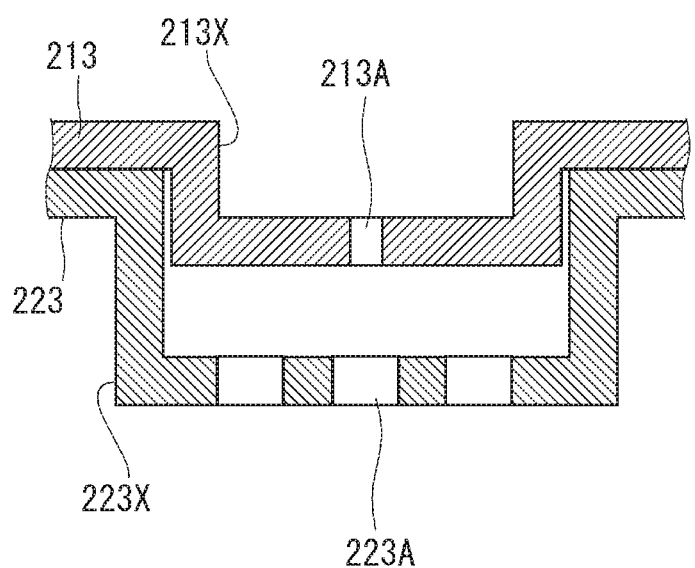
FIG. 5 is a cross-sectional view for describing a heat dissipation structure according to a modified example 3 of the first embodiment of the present disclosure.
Figure 5:
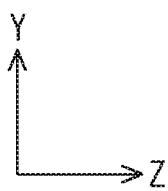

FIG. 5 shows a heat dissipation structure 300C according to a modified example 3 of the first embodiment. In the heat dissipation structure 300C according to the modified example 3, one outlet 213A having a size the same as that of the outlets 213A according to the modified example 2 is formed in the bottom surface part of the concave-shaped part 213X. Further, the position of the outlet 213A provided in the bottom surface part of the concave-shaped part 213X in the Z-axis direction is the same as the position of the central one of the outlets 223A provided in the bottom surface part of the concave-shaped part 223X in the Z-axis direction. Further, the depth of the concave-shaped part 213X in the modified example 3 is smaller than the depth of the concave-shaped part 213X in the modified example 2. On the other hand, the shape of the concave-shaped part 223X and the number and the size of the outlets 223A according to the modified example 3 are the same as those of the concave-shaped part 223X according to the modified examples 1 and 2. Therefore, the distance between the bottom surface part of the concave-shaped part 213X and the bottom surface part of the concave-shaped part 223X in the modified example 3 is wider than the distance between the bottom surface part of the concave-shaped part 213X and the bottom surface part of the concave-shaped part 223X according to the modified example 2. That is, in the modified example 3, unlike the examples described in the modified examples 1 and 2, parameters adjusted so that heat is more likely to be transferred (the depth of the concave-shaped part 213X, and overlapping of the position of the outlet 213A in the Z-axis direction and the position of the outlet 223A in the Z-axis direction) and parameters adjusted so that heat is not likely to be further transferred (the size and the number of outlets 213A, and the distance between the bottom surface part of the concave-shaped part 213X and the bottom surface part of the concave-shaped part 223X) are combined with each other. Accordingly, in the heat dissipation structure 300C according to the modified example 3, the heat and the temperature transferred to the top surface part 213 are eventually adjusted in such a way that they become similar to those of the heat dissipation structures 300A and 300B according to the modified examples 1 and 2.

Modified Example 4

Figure 6:
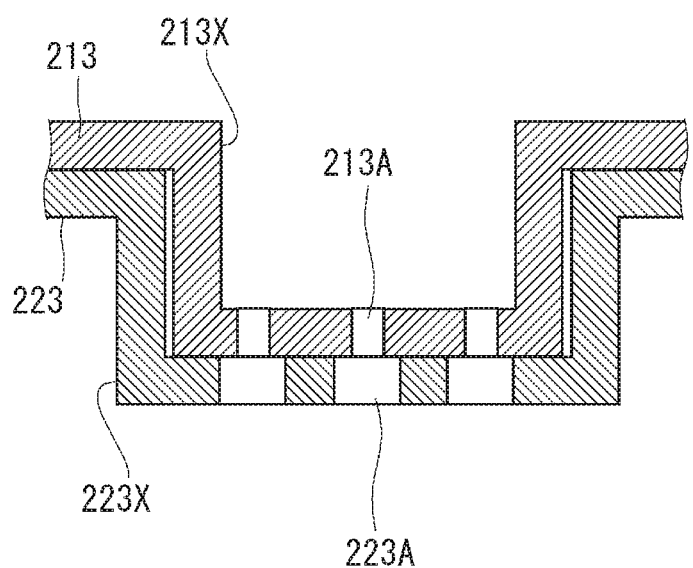
FIG. 6 is a cross-sectional view for describing a heat dissipation structure according to a modified example 4 of the first embodiment of the present disclosure.

FIG. 6 shows a heat dissipation structure 300D according to a modified example 4 of the first embodiment. In the heat dissipation structure 300D according to the modified example 4, three outlets 213A having the size the same as that of the outlets 213A in the modified examples 2 and 3 are formed in the bottom surface part of the concave-shaped part 213X. Further, the positions of the outlets 213A provided in the bottom surface part of the concave-shaped part 213X in the Z-axis direction is the same as the positions of the outlets 223A provided in the bottom surface part of the concave-shaped part 223X in the Z-axis direction. Further, the depth of the concave-shaped part 213X in the modified example 4 is larger than the depth of the concave-shaped part 213X in the modified example 1. On the other hand, the shape of the concave-shaped part 223X and the number and the size of the outlets 223A in the modified example 4 are the same as those of the concave-shaped part 223X in the modified examples 1-3. Therefore, the distance between the bottom surface part of the concave-shaped part 213X and the bottom surface part of the concave-shaped part 223X in the modified example 4 is smaller than the distance between the bottom surface part of the concave-shaped part 213X and the bottom surface part of the concave-shaped part 223X in the modified example 1. Specifically, the bottom surface part of the concave-shaped part 213X and the bottom surface part of the concave-shaped part 223X in the modified example 4 substantially contact each other. That is, in the modified example 4, compared to the modified examples 1-3, parameters adjusted so that heat is likely to be further transferred (the distance between the bottom surface part of the concave-shaped part 213X and the bottom surface part of the concave-shaped part 223X, overlapping of the positions of the outlets 213A in the Z-axis direction and the positions of the outlets 223A in the Z-axis direction, and the number of positions thereof that overlap each other) and parameters adjusted so that heat is not likely to be further transferred (the depth of the concave-shaped part 213X, and the sizes of the outlets 213A) are combined with each other. Accordingly, in the heat dissipation structure 300D according to the modified example 4, the heat and the temperature transferred to the top surface part 213 are adjusted in such a way that they eventually become similar to those in the heat dissipation structures 300A, 300B, and 300C in the modified examples 1-3.

As shown in modified examples 1-4, there are numerous combinations of parameters, and by finely combining the parameters adjusted so that heat is likely to be transferred with the parameters adjusted so that heat is not likely to be transferred, the temperature can be adjusted in a flexible way for each place (for each combination of the concave-shaped part 213X with the concave-shaped part 223X). In the aforementioned modified examples 1-4, for the purpose of simplification of the explanation, the concave-shaped parts 223X have a common shape and only the parameters of the concave-shaped parts 213X are adjusted. As a matter of course, in reality, however, besides the parameters of the concave-shaped parts 213X, the parameters of the concave-shaped parts 223X are appropriately adjusted so that heat is likely to be transferred or heat is not likely to be transferred, whereby it is possible to perform adjustment more finely.

Note that the present disclosure is not limited to the above-described embodiment and may be changed as appropriate without departing from the spirit of the present disclosure. For example, while the example in which the heat dissipation structure 300 is provided in the top surface part of the housing 200 (the top surface part 213 of the first housing part 210 and the top surface part 223 of the second housing part 220) has been described in the above-described embodiment, the heat dissipation structure 300 having a similar configuration may be provided in another surface of the housing 200. However, since the heat dissipation structure 300 is provided with an outlet, the heat dissipation structure 300 is preferably positioned in an upper part of the housing 200. Further, the heat dissipation structure 300 may be provided on each of a plurality of surfaces of the housing 200.

Further, while the example in which the top surface parts 213 and 223 become higher in a stepwise manner along the Z-axis direction in the heat dissipation structure 300 has been described in the above-described embodiment, the top surface parts 213 and 223 may be formed in such a way that they become higher in a stepwise manner along all the directions in the plane substantially perpendicular to the Y axis. The same holds true for a case in which the heat dissipation structure 300 is provided in another surface of the housing 200. In an actual apparatus, a plurality of heat generating sources 102 are arranged or a heat sink like component is arranged in the housing 200. Therefore, depending on the arrangement of the heat generating source 102 and the shape of the heat sink like component, the distribution of the temperature and the flow rate of the air in the housing 200 become complicated. Therefore, in accordance with the distribution of the temperature and the flow rate of the air in the housing 200, the depth of the concave-shaped part of the heat dissipation structure 300 may not be changed regularly and in a stepwise manner, and it may be freely changed for each place.

Further, the sizes and the shapes of the concave-shaped parts in the heat dissipation structure 300 may be changed as needed. Specifically, at least one of the sizes and the shapes of the concave-shaped parts in the heat dissipation structure 300 may be determined in accordance with the distance between the concave-shaped parts and the heat generating source 102 and the distribution of the temperature and the flow rate of the air in the housing 200. While the example in which the depths of the concave-shaped parts are changed for each place has been described in the above-described embodiment, the air may be guided to a desired direction by tilting the front surface, the rear surface, and the wall surface of the bottom surface part of the concave-shaped part or changing the thickness of the bottom surface part or the wall part of the concave-shaped part. Further, the height of the wall part of the concave-shaped part may be changed or a through-hole may be provided in this wall part.

Further, the aforementioned change is performed in two concave-shaped parts opposed to each other (e.g., the concave-shaped part 213B and the concave-shaped part 223B), which causes the amount of regulation of the temperature distribution of the surface of the housing 200 to be further increased.

Further, the distance between the bottom surface parts of the concave-shaped parts opposed to each other in the heat dissipation structure 300 (e.g., the bottom surface part of the concave-shaped part 213B and the bottom surface part of the concave-shaped part 223B) may be determined in accordance with the distance between the concave-shaped part and the heat generating source 102 and the distribution of the temperature and the flow rate of the air in the housing 200. Note that the bottom surface parts of two concave-shaped parts opposed to each other may contact each other. In this case, heat is directly conducted in the two concave-shaped parts, which may become one of the parameters for regulating the temperature distribution of the surface of the housing 200.

Further, the arrangement and the number of concave-shaped parts provided in the heat dissipation structure 300 are optimized for each place in accordance with the temperature distribution inside the housing 200, and are not limited to those shown in the aforementioned first embodiment. That is, the arrangement of the concave-shaped parts of the heat dissipation structure 300 may be determined according to the distance between the concave-shaped parts and the heat generating source 102 and the distribution of the temperature and the flow rate of the air in the housing 200. Further, while the example in which the concave-shaped parts are adjacent to each other and these concave-shaped parts integrally form the top surface part 213 of the first housing part 210 and the top surface part 223 of the second housing part 220 has been described in the aforementioned first embodiment, these concave-shaped parts may be separated from each other or may overlap each other. In the heat dissipation structure 300, a plurality of concave-shaped parts that overlap each other may be provided. In this case, one set of overlapping concave-shaped parts may be arranged in such a way that it is separated from another concave-shaped parts, and the other set of overlapping concave-shaped parts may be arranged in such a way that it is adjacent to the another concave-shaped parts.

Further, at least one of the shape, the number, and the arrangement of the outlets 213A and 223A provided in the plurality of concave-shaped parts in the heat dissipation structure 300 may be determined in accordance with the distance between the concave-shaped parts and the heat generating source 102 and the distribution of the temperature and the flow rate of the air in the housing 200. Further, while the example in which the shape of the inlets 212A and 222A and the outlets 213A, 223A, 212B, and 222B is a rectangular shape has been described in the above-described embodiment, the shape of the inlets 212A and the 222A and the outlets 213A, 223A, 212B, and 222B may be triangle, polygonal, circular or the like. The shape of the inlets 212A and 222A and the outlets 213A, 223A, 212B, and 222B may become one of the parameters for regulating the temperature distribution of the surface of the housing 200. Further, by changing the size, the number, and the arrangement of the inlets 212A and 222A and the outlets 213A, 223A, 212B, and 222B, the amount of the regulation of the temperature distribution of the surface of the housing 200 is further increased.

Further, the heat dissipation structure 300 may include convex-shaped parts in place of the concave-shaped parts. Specifically, the top surface part 213 of the first housing part 210 may include, for example, convex-shaped parts in place of the concave-shaped parts 213B, 213C, 213D, 213E, and 213F. Further, the top surface part 223 of the second housing part 220 may include convex-shaped parts in place of the concave-shaped parts 223B, 223C, 223D, 223E, and 223F. By setting the parameters such as the number, the shape, the position and the like of the convex-shaped parts and the number, the shape, the position and the like of the outlets provided in each of the convex-shaped parts in various ways, it is possible to improve the heat dissipation efficiency and regulate the temperature distribution of the surface of the housing 200 (top surface in this first embodiment).

Further, while the example in which the heat dissipation structure 300 is formed of the top surface part 213 of the first housing part 210 and the top surface part 223 of the second housing part 220, which are constituting members of the housing 200 opposed to each other, has been described in the above-described embodiment, the heat dissipation structure 300 may be formed of members other than the constituting members of the housing 200. Further, the heat dissipation structure 300 may be formed of three or more members opposed to one another. Further, when a frame member having a heat dissipation distribution function is arranged in the housing 200, the heat dissipation structure 300 may be formed in combination with the above frame member.

The regulation of the temperature distribution of the surface of the housing 200 by the heat dissipation structure 300 according to the present disclosure is not limited to making the temperature distribution uniform. When there is an area where there is no danger of human contact inside or outside the housing 200, for example, the heat dissipation structure 300 may perform regulation of concentrating the heat of the air in the housing 200 in this area for heat transfer. Further, when there is an area in the housing 200 such as a user operation unit where it is desired to have a low temperature, the heat dissipation structure 300 may perform regulation for not transferring heat in the air in the housing 200 to this area.

Further, while the example in which the air heated by the heating generating source 102 or the like in the housing 200 convects by so-called natural convection has been described in the above-described embodiment, the heat dissipation structure 300 according to the present disclosure can be applied also to a case in which the air in the housing 200 convects by forced convection using a fan or the like.

According to the present disclosure, it is possible to provide the heat dissipation structure capable of improving the heat dissipation efficiency and regulating the temperature distribution of the surface of the housing.

The first, second, third and fourth examples can be combined as desirable by one of ordinary skill in the art.

While the disclosure has been particularly shown and described with reference to embodiments thereof, the disclosure is not limited to these embodiments. It will be understood by those of ordinary skill in the art that various changes in form and details may be made therein without departing from the spirit and scope of the present disclosure as defined by the claims.

What is claimed is:

1. A heat dissipation structure provided in a housing that accommodates a substrate which is parallel to the side surface part of the housing and a heat generating source which is mounted on the substrate therein, wherein the heat dissipation structure is positioned above the substrate and is perpendicular to the substrate, and the heat dissipation structure comprising:
   a plurality of constituting members opposed to each other and the plurality of constituting members is perpendicular to the substrate, wherein
   each of the constituting members includes a plurality of concave-shaped parts that are aligned,
   at least a part of the plurality of concave-shaped parts of one of the constituting members is opposed to at least a part of the plurality of concave-shaped parts of another one of the constituting members, and
   at least one outlet is formed in at least a part of the plurality of concave-shaped parts of each of the constituting members,
   wherein the distance between bottom surface parts of the plurality of concave-shaped parts of one of the constituting members and bottom surface parts of the plurality of concave-shaped parts of another one of the constituting members that are opposed to the bottom surface parts of the plurality of concave-shaped parts of the one of the constituting members is determined in accordance with at least a distance between the concave-shaped part and the heat generating source.

2. The heat dissipation structure according to claim 1, wherein at least one of the size and the shape of each of the plurality of concave-shaped parts is determined in accordance with at least a distance between the concave-shaped part and the heat generating source.

3. The heat dissipation structure according to claim 1, wherein arrangement of the plurality of concave-shaped parts in each of the constituting members is determined in accordance with at least a distance between the concave-shaped part and the heat generating source.

4. The heat dissipation structure according to claim 1, wherein at least one of shape, number, and arrangement of the outlets provided in each of the plurality of concave-shaped parts is determined in accordance with at least a distance between the concave-shaped part and the heat generating source.

5. The heat dissipation structure according to claim 1, wherein depth of one of the concave-shaped parts is bigger or smaller than depth of another one of the concave-shaped parts, when the one of the concave-shaped parts is near from a part in the vicinity of a part immediately above the heat generating source than the another one of the concave-shaped parts.

6. The heat dissipation structure according to claim 1, wherein
number of the outlets provided in one of the concave-shaped parts is bigger or smaller than number of the outlets provided in another one of the concave-shaped parts, when the one of the concave-shaped parts is near from a part in the vicinity of a part immediately above the heat generating source than the another one of the concave-shaped parts.

7. The heat dissipation structure according to claim 1, wherein size of the outlets provided in one of the concave-shaped parts is bigger or smaller than size of the outlets provided in another one of the concave-shaped parts, when the one of the concave-shaped parts is near from a part in the vicinity of a part immediately above the heat generating source than the another one of the concave-shaped parts.

8. The heat dissipation structure according to claim 1, wherein
a position of at least a part of a plurality of outlets provided in one of the constituting members is different from that of at least a part of a plurality of outlets provided in another one of the constituting members, and
deviation between the position of the outlet provided in one of the constituting members and the position of the outlet provided in the other one of the constituting members becomes big or small as the distance from the part in the vicinity of the part immediately above the heat generating source increases.

9. The heat dissipation structure according to claim 1, wherein distance between bottom surface parts of the plurality of concave-shaped parts of one of the constituting members and bottom surface parts of the plurality of concave-shaped parts of another one of the constituting members that are opposed to the bottom surface parts of the plurality of concave-shaped parts of the one of the constituting members becomes big or small as the distance from the part in the vicinity of the part immediately above the heat generating source increases.

* * * * *